United States Patent
Nguyen et al.

[19]

[11] Patent Number: 5,982,241
[45] Date of Patent: Nov. 9, 1999

[54] MONOLITHIC OSCILLATOR UTILIZING FREQUENCY-LOCKED LOOP FEEDBACK NETWORK

[75] Inventors: Cong Dinh Nguyen, Sachse; Stephen Christopher Brightman, Dallas, both of Tex.

[73] Assignee: Dallas Semiconductor Corporation, Dallas, Tex.

[21] Appl. No.: 08/903,820

[22] Filed: Jul. 31, 1997

[51] Int. Cl.$^6$ ...................................................... H03L 7/00
[52] U.S. Cl. ............................ 331/49; 331/176; 331/74; 331/1 R; 331/177 R
[58] Field of Search ................................. 331/177 R, 49, 331/111, 143, 175, 176, 1 R, 74; 327/159

[56] References Cited

U.S. PATENT DOCUMENTS

| | | | |
|---|---|---|---|
| 5,369,377 | 11/1994 | Benhamida | 331/49 |
| 5,594,388 | 1/1997 | O'Shaughnessy et al. | 331/1 R |
| 5,623,234 | 4/1997 | Shaik et al. | 331/49 |
| 5,684,434 | 11/1997 | Mann et al. | 331/16 |

*Primary Examiner*—Arnold Kinkead
*Attorney, Agent, or Firm*—Jenkins & Gilchrist P.C.

[57] ABSTRACT

A monolithic oscillator having dual programmable fixed frequency outputs includes crystal-less oscillator circuitry utilizing frequency-locked feedback to generate ai signal having a select frequency, the frequency being stabilized over temperature and voltage by compensation circuitry associated with the crystal-less oscillator circuitry. A programmable prescaler is coupled to the crystal-less oscillator circuitry for varying the frequency of the signal generated by the crystal-less oscillator circuitry by a select amount. The monolithic oscillator further includes inputs for receiving an external signal, such as an external reference signal, or for connection to a crystal for providing an alternative frequency reference. A multiplexer is used to select either the external signal (or crystal) or the signal from the crystal-less oscillator circuitry to be used for the output signal. Monolithic oscillator further includes a programmable frequency divider coupled to the multiplexer to vary the frequency of the signal from the multiplexer by a select amount to one of the dual outputs. The other output being used as a reference output.

17 Claims, 3 Drawing Sheets

MONOLITHIC OSCILLATOR UTILIZING FREQUENCY-LOCKED LOOP FEEDBACK NETWORK

FIELD OF THE INVENTION

This invention relates to oscillator circuits, and more particularly, but not by way of limitation, to a monolithic oscillator integrated circuit which can be programmed to produce a set frequency from a selected range of frequencies by utilizing a programmable frequency divider and prescaler to produce the desired output frequencies, and further can receive an external signal to produce a stable reference signal.

BACKGROUND OF THE INVENTION

There is a wide commercial market available for the use of high performance electronic real time clocks. One significant feature requirement of high performance electronic real time clocks is the use of a crystal to generate the time base for the oscillator circuitry. For example, a conventional prepackaged crystal oscillator includes a quartz crystal to provide the frequency reference, and an oscillator amplifier to excite the crystal to resonance, while other crystal oscillator circuit packages utilize an external quartz crystal. However, as the consumer need for more smaller and less expensive electronic systems continues to be a driving force behind the development of many new products and systems that don't need quite the accuracy of a crystal oscillator but do need a relatively precise oscillator, the cost and size of conventional crystal oscillator real time clocks make them prohibitive.

One solution to the conventional crystal oscillator has been through the use of the RC oscillator circuit. Although this has proven to be a somewhat acceptable solution for systems which require low performance oscillator circuits, it has fallen short for systems requiring more precise oscillator circuits. This is primarily because current RC oscillator circuits are not very stable during operation. The reason current RC oscillators are not very stable is because there is no stable oscillator element for the circuit to phase-lock to or to count down from. As with crystal oscillator circuits, another problem with conventional RC oscillator circuits is they take up too much valuable pc-board space.

Accordingly, based upon the foregoing, it should be understood and appreciated that there is a need for a low power, programmable, monolithic crystal-less integrated circuit oscillator that provides an output signal having a select stable frequency approaching the stability of conventional crystal oscillators, and includes circuitry that provides compensation for the temperature coefficients of the frequency determinative elements therein.

SUMMARY OF THE INVENTION

The present invention overcomes the above identified problems as well as other shortcomings and deficiencies of existing technologies by providing a monolithic oscillator integrated circuit which can be programmed to produce a frequency from a selected range of frequencies by utilizing a programmable frequency divider and programmable prescaler to produce the desired output frequencies, and further can receive an external signal to produce a stable reference signal.

The present invention further provides a monolithic oscillator having dual programmable fixed frequency outputs, and includes crystal-less oscillator circuitry utilizing frequency-locked feedback to generate a signal having a select frequency, the frequency being stabilized over a select temperature and voltage range by compensation circuitry associated with the crystal-less oscillator circuitry. A programmable prescaler is coupled to the crystal-less oscillator circuitry for varying the frequency of the signal generated by the crystal-less oscillator circuitry by a select amount. The monolithic oscillator further includes inputs for receiving an external signal, such as an external reference signal, or for connection to a crystal for providing an alternative frequency reference. A multiplexer is used to select either the external signal (or external crystal) or the signal from the crystal-less oscillator circuitry to be used for the output signal. The monolithic oscillator further includes a programmable frequency divider coupled to the multiplexer to vary the frequency of the signal from the multiplexer by a select amount to one of the dual outputs. The other output being used as a reference output at the frequency of the signal from the multiplexer.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
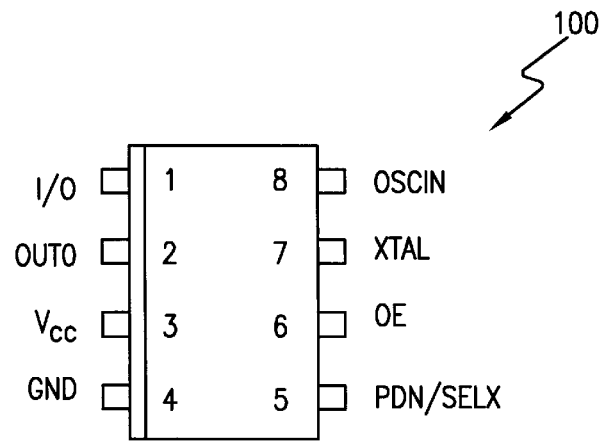
FIG. 1 is a package diagram illustrating a 8-pin SOIC package containing the present invention.

Referring now to the drawings wherein like or similar elements are designated with identical reference numerals throughout the several views, and wherein the various elements depicted are not necessarily drawn to scale, and in particular, to FIG. 1, there is illustrated a exemplary electronics package of a monolithic oscillator 100 in an 8-pin small outline integrated circuit (SOIC) package. The pin assignment for this exemplary embodiment of monolithic oscillator 100 in the 8-pin SOIC package is as follows: pin 1, I/O, the input/output pin, pin 2, OUTO pin, a reference output; pin 3, Vcc, the power connection pin; pin 4, GND, the ground pin; pin 5, PDN/SELX, is the power-down/select function pin; pin 6, OE, the output enable pin; pin 7, XTAL, for connection to an external crystal; and pin 8, OSCIN, for connection to an external reference frequency. Although the monolithic oscillator 100 is depicted in an SOIC package, it is contemplated that the present invention could be utilized in virtually any type of integrated circuit packages, such as DIPs, QUIPs, SOPs, QSOPs and the like. These packages allow the generation of a clock signal using minimal board area.

In general, monolithic oscillator 100 is an on-board single-chip oscillator device which is programmable to produce a clock signal having a stable set frequency from a selected frequency range, such as between 20 kHz to 100 MHz, with no external components necessary for operation.

A programmable divider and prescaler, set via bits stored in EEPROM registers, are used to produce the desired output frequencies. The values of the data needed to produce the desired output frequencies can be pre-programmed during manufacturing or user configured. Monolithic oscillator 100 can maintain a 1% accuracy over a selected temperature and voltage range. As an alternative to the single on-board oscillator, an external clock signal or external crystal may be used by monolithic oscillator 100 as a reference signal. The choice of signal whether from the internal oscillator or from an external source can be made by a user when monolithic oscillator 100 is in program mode or is "on the fly".

Figure 2:
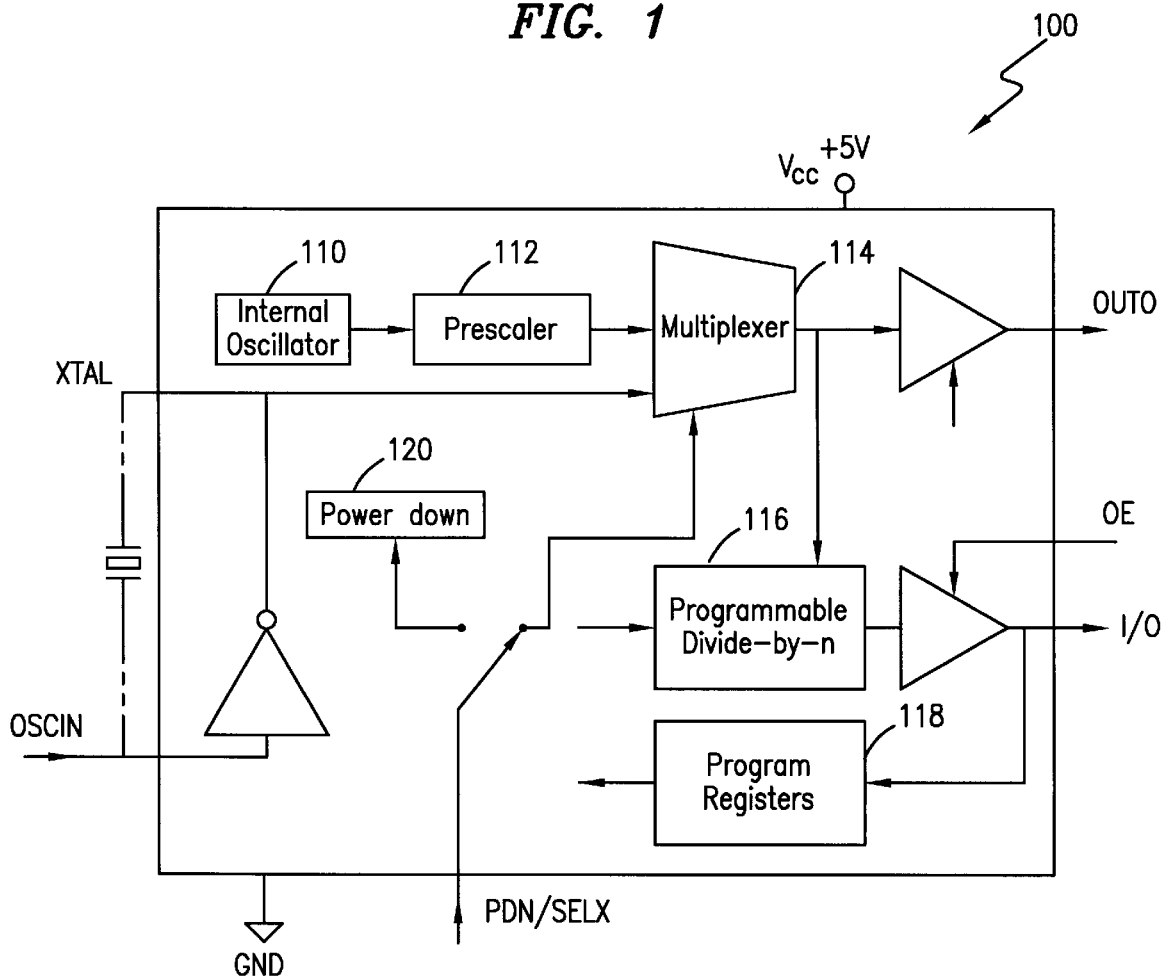
FIG. 2 is a functional block diagram illustrating the present invention.
Figure 3:
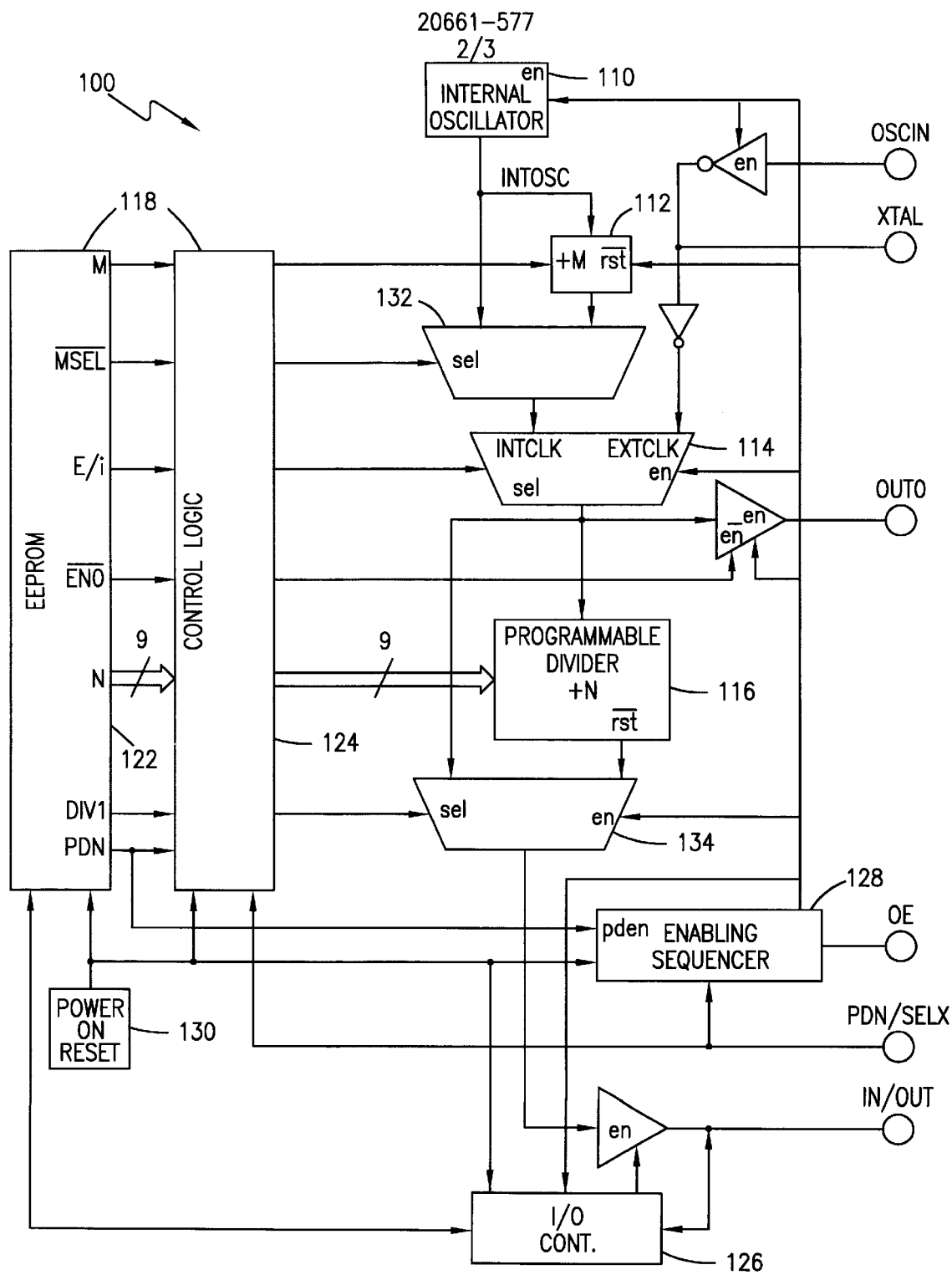
FIG. 3 is a functional block diagram, as similarly shown in FIG. 2, showing more detail.

With reference now to FIGS. 2 and 3, there are illustrated functional block diagrams illustrating the basic functions and operation of the monolithic oscillator 100. The purpose of these block diagrams are to illustrate, among other things, the features of the present invention and the basic principles of operation thereof. These block diagrams are not necessarily intended to schematically represent particular control paths. Referring in particular to FIG. 2, there is illustrated a functional block diagram of monolithic oscillator 100, in accordance with the principles of the present invention. As illustrated, monolithic oscillator 100 includes an internal oscillator 110, a prescaler 112, a multiplexer 114, a programmable divide-by-N 116, program registers 118, and power down 120. Internal oscillator 110 (described in more detail with reference to FIGS. 4 and 5) is a programmable on-board voltage controlled oscillator which can be used as a timing reference without any external timing components. Internal oscillator 110 includes crystal-less oscillator circuitry and employs a frequency-lock feedback loop (FLL) to generate a clock signal, and further maintains a 1% accuracy over a selected temperature and voltage range. However, potentially higher accuracy can be obtained using the circuitry illustrated in FIG. 4 limited by the resolution of the device and/or test/program equipment.

Still referring to FIGS. 2 and 3, prescaler 112 receives the clock signal from internal oscillator 110 and if activated can divide the frequency of the signal by a selected value, such as 1, 2 or 4 times. The value by which the frequency is to be divided down is user selected and stored in the program register 118.

Multiplexer 114 switches the operation of monolithic oscillator 100 between utilizing the internal oscillator signal received from internal oscillator 110 and an external reference signal. Programmable Divide-by-N 116 is a user programmable EEPROM frequency divider which is used to further divide the frequency of the signal to be output (whether the internal signal or the external signal) for monolithic oscillator 100. Prescaler 112 and Programmable Divide-by-N 116 allows a user to acquire an off-the-shelf component and program it on site prior to utilizing monolithic oscillator 100 in board production.

Referring now to FIGS. 2 and 3, program register 118 is programmable by the user and is used to determine the operating frequency and mode of operation of monolithic oscillator 100. The register settings are non-volatile with the values being stored automatically in EEPROM 122 when the registers are programmed.

Referring again to FIG. 2, power down 120, when activated by the appropriate signal received at PDN/SELX, places monolithic oscillator 100 in a power down mode. If the power down function is selected, internal oscillator 110 of monolithic oscillator 100 stops oscillating and monolithic oscillator 100 goes into a reduced power consumption state.

Still referring to FIGS. 2 and 3, as illustrated and as described above, monolithic oscillator 100 includes pins OSCIN and XTAL for connection to an external clock reference or a crystal reference. This allows for two additional features for monolithic oscillator 100, the first being that an external reference, such as a direct system clock, can be used as a timing reference for monolithic oscillator 100, whereby a user can then utilize monolithic oscillator 100 to generate submultiples of the external reference signal and retain the system's clock accuracy. Second, an external crystal can be used to produce an external stable reference. These two features allow the precision of crystal with the easy generation of clock sub-multiples, while also allowing the power down features described hereinabove and the flexible enabling features described herein below.

Referring to FIGS. 2 and 3, I/O pin operates as a dual purpose pin. If monolithic oscillator 100 is powered up in a program mode, such as when a user wants to program the divide-by-N 116, the I/O pin is used to input serial data to the program registers 118. After a write command has been received, this data is stored in the non-volatile memory 118. When monolithic oscillator 100 is powered up in the operating mode, the data is automatically restored to the on-chip registers and the I/O pin is utilized for the output of monolithic oscillator 100. I/O controller 126 (see FIG. 3) controls the mode of operation of I/O pin, switching it between the input mode and the output mode.

As illustrated in FIGS. 2 and 3, PDN/SELX pin provides a user-selectable function (power down or select) which is determined by a select bit of the programmable memory. If the power down function is selected, internal oscillator 110 of monolithic oscillator 100 can be completely powered down and will stop oscillating and monolithic oscillator 100 will go into a reduced power consumption state. Even if an external reference or a crystal is being used, all of the on-chip buffers are powered down to minimize the current drain.

If the select function is chosen, PDN/SELX pin is used to receive a signal to switch between the internal oscillator 110 and the external reference (or crystal). This can be performed during operation of monolithic oscillator 100.

OUTO pin is a reference output and is available from the output of the reference select of multiplexer 114 and is located ahead of the programmable divide-by-N 116. This output is especially useful as a buffered output of a crystal defined master frequency.

Still referring to FIGS. 2 and 3, as illustrated, monolithic oscillator 100 features a "synchronous" output enable pin, OE. Since the output enable OE, internal oscillator, and/or external oscillator are likely all asynchronous, there is the possibility of timing difficulties, in the operation of monolithic oscillator 100. To minimize these difficulties monolithic oscillator 100 includes an enabling sequencer 128 (see FIG. 3) to produce predictable results when monolithic oscillator 100 is enabled and disabled. In particular, the output gating is configured so that truncated output pulses can never be produced.

As further illustrated in FIG. 3, monolithic oscillator 100 includes a power-on-reset 130. When power is initially applied to monolithic oscillator 100, a power-on-reset sequence is executed. This power-on-reset sequence comprises generally two stages, a conventional power-on-reset to initialize all on-chip circuitry, and a stabilization period to allow the internal oscillator 110 to reach a stable frequency before the outputs are enabled. Monolithic oscillator 100 also includes multiplexers 132 and 134 (see FIG. 3). Multiplexer 132 controls the implementation of prescaler 112, while multiplexer 134 controls the implementation of programmable divide-by-N 116 to the output signal.

Still referring to FIG. 3, program registers 118 include an EEPROM 122 and control logic 124, which, among other things, are used to store and control the user's programmable data to operate prescaler 112, multiplexers 114, 132 and 134, and programmable divide-by-N 116.

Figures 4, 5:
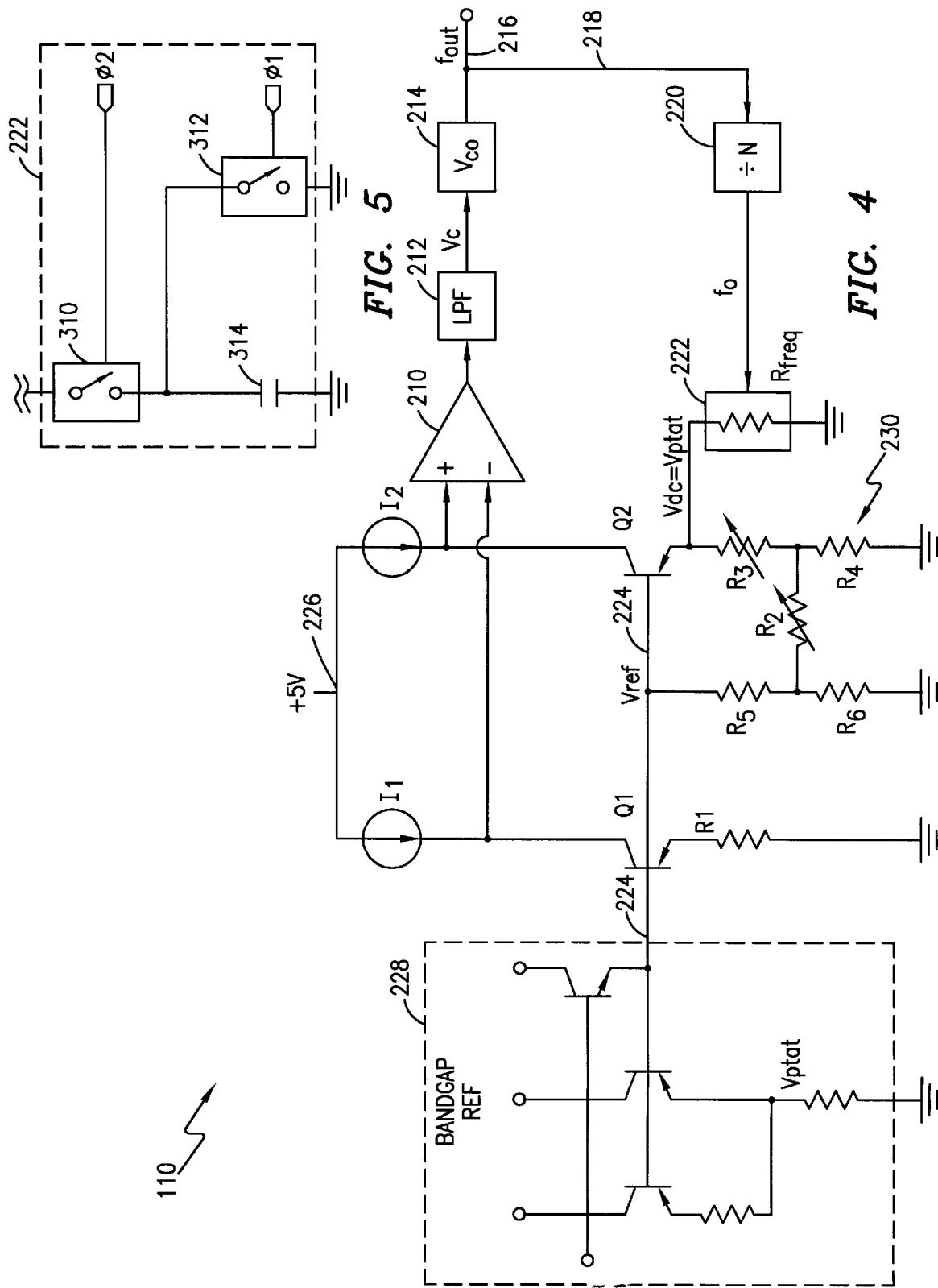
FIG. 4 is a schematic diagram illustrating the crystal-less oscillator circuitry and temperature compensation circuitry in accordance with the present invention.
FIG. 5 is a schematic diagram illustrating an embodiment of a frequency-controlled resistor utilized in the present invention.

With reference now to FIG. 4, there is illustrated a schematic diagram illustrating an exemplary embodiment of internal oscillator 110. As depicted internal oscillator 110, includes two current sources, $I_1$ and $I_2$, each being connected to the inputs of difference amplifier 210. The output of difference amplifier 210 is connected to the input of a low pass filter 212. The output of low pass filter 212 is connected to the input of a voltage controlled oscillator 214. The output of voltage controlled oscillator 214 is connected to the output 216 of internal oscillator 110. A frequency-lock feedback loop 218 is connected between output 216 and an input of difference amplifier 210. Frequency-lock feedback loop 218 includes a divide-by-N circuit 220, a frequency-controlled resistor $R_{freq}$ 222, and a transistor $Q_2$.

Still referring to FIG. 4, internal oscillator 110 further includes an input 224 for receiving a reference voltage, $V_{ref}$, an input 226 for receiving operating voltage Vcc, transistor $Q_1$ and resistor $R_1$. The above described elements, generally make up the crystal-less oscillator circuitry of internal oscillator 110 (the operation of which is described in more detail below).

As further depicted in FIG. 4, crystal-less oscillator circuitry 100 also includes a resistor network 230 which includes variable/trimmable resistors $R_2$ and $R_3$, and resistors $R_4$, $R_5$ and $R_6$, and a bandgap reference 228 for generating reference voltage $V_{ref}$ at input 224 and for generating a voltage proportional to absolute temperature ($V_{ptat}$). The voltages from bandgap reference 228 and resistor network 230 provide compensation for fluctuation in the frequency of the output signal due to the temperature coefficient of $R_1$. A detailed description of the operation of internal oscillator 110 including the operation of bandgap reference 228 with resistor network 230 is given hereinbelow.

Referring now to FIG. 5, there is illustrated an exemplary embodiment of frequency-controlled resistor $R_{freq}$ 222. As depicted, frequency-controlled resistor $R_{freq}$ 222 is coupled in frequency-lock feedback loop 218 and is a switched-capacitor circuit, including switches 310 and 312, and capacitor 314.

Referring now to FIGS. 4 and 5, a more detailed description of the operation of internal oscillator 110 will now be described. The output of voltage controlled oscillator 214, $f_{out}$, is the output of internal oscillator 110. Divide-by-N circuit 220 divides down the frequency of the output signal of voltage controlled oscillator 214 to produce a feedback frequency signal, $f_o$, which is utilized in feedback loop 218 to stabilize and control the output frequency $f_{out}$. Control voltage $V_C$ is for driving voltage controlled oscillator 214, and is derived from resistors $R_1$ and $R_{freq}$. Resistors $R_1$ and $R_{freq}$ are fed by current sources $I_1$ and $I_2$, such that the voltages across resistors $R_1$ and $R_{freq}$ drive difference amplifier 210. The output of difference amplifier 210 is fed into low pass filter 212. Low pass filter 212 removes the high frequency noise from the signal from the output of amplifier 210. The output of low pass filter 212 is the control voltage $V_C$, which is used by voltage control oscillator 214 to generate the output frequency $f_{out}$.

In this exemplary embodiment, frequency-controlled resistor, $R_{freq}$, is a switched-capacitor circuit, as is illustrated in FIG. 2. Switches 310 and 312 turn on and off with alternate non-overlapping phases φ1 and φ2 of the feedback frequency $f_o$. The charge Q on the switched-capacitor 314 is represented by the equation:

$$Q32\ CV.$$

The current running through the switched-capacitor 314 is given by the equation:

$$I=C(dV/dT)=CV/T$$

where T is defined as $1/f_o$. As a result, the current is equal to $f_oCV$. Because R=V/i, the effective resistance of $R_{freq}= 1/f_oC$, where C is the value of the capacitor of switched capacitor 314. Therefore as the output frequency $f_o$ increases, the resistance value of $R_{freq}$ decreases. As a result, the voltage at the plus input of the difference amplifier drops, reducing the value of the control voltage $V_C$ received by voltage controlled oscillator 214. And, because the output frequency, $f_{out}$, of voltage control oscillator 214 is directly proportional to the control voltage Vc, the output frequency, $f_{out}$, will decrease when the resistance value of $R_{freq}$ decreases. When the resistance value of $R_{freq}$ equals the resistance value of $R_1$, feedback loop 218 is in a "lock" condition and the control voltage $V_C$ will remain constant. When $V_C$ remains constant, the output frequency $f_{out}$ is also constant. Because internal oscillator 110 is a standalone oscillator, there is no external reference frequency onto which oscillator 100 can "lock", as is the case with phase-locked loop (PLL) circuits.

The output frequency $f_{out}$ of internal oscillator 110 is given by the equation:

$$f_{out}=N/(R_1C)$$

Therefore, the output frequency $f_{out}$ of internal oscillator 110 is determined by the value of N (the frequency divider number of divide-by-N circuit 220), the resistance value of $R_1$, and the value of switched capacitor 314.

By operating resisters $R_1$ and $R_{freq}$ from current sources $I_1$ and $I_2$, along with the frequency-lock feedback loop 218, a low voltage sensitivity is maintained, so long as the open-loop gain of amplifier 210 is high.

As described above, the expected frequency of the output signal at the output $f_{out}$ of internal oscillator 110 depends upon the resistance value of resistor $R_1$ and the capacitance value of C, the value of the capacitor in switched capacitor 314. Therefore, as the resistance value of $R_1$ and the capacitance value of switched capacitor 314 vary, the frequency of the output signal of output $f_{out}$ will also vary. As can also be appreciated, these values will vary with varying operating temperatures. The extent that these elements vary with temperature is dependent upon their respective temperature coefficients, i.e. the closer the temperature coefficient of the element is to zero, the less the absolute value of the element will change over temperature. To reduce the effects of temperature on switched capacitor 314 good results have been achieved by using a typical CMOS capacitor therefore. This provides for a very low temperature coefficient for switched capacitor 314, such that, over selected temperature operating ranges, the variance of the capacitance of switched capacitor 314 is negligible (i.e. it has a very low temperature coefficient). However, the same could not be achieved for resistor $R_1$, where the temperature coefficient of resistor $R_1$ could not be significantly reduced. Therefore, resistor network 230, which includes variable resistors $R_2$ and $R_3$, and resistors $R_4$, $R_5$ and $R_6$, and bandgap reference 228 are used to compensate for the temperature coefficient of resistor $R_1$ and therefore stabilize the frequency of the output signal at $f_{out}$ 216.

Still referring to FIGS. 4 and 5, bandgap reference 128 generates $V_{ref}$, a reference voltage, and $V_{ptat}$, a voltage proportional to absolute temperature, with each of the temperature coefficients known for both $V_{ref}$ and $V_{ptat}$. As illustrated in FIG. 4, resistors $R_3$ and $R_4$ are generally added in parallel to frequency-controlled resistor $R_{freq}$. As the current to capacitor 314 of frequency controlled resistor $R_{freq}$ is highly variable, i.e. Q2 is turned on and off, $R_3$ and $R_4$ stabilize the current through Q2 and therefore also stabilize the current to switched capacitor 314. $R_3$ is a trimmable variable resistor so that it can be trimmed to help compensate for the absolute value of the temperature coefficient of the combination of resistor $R_1$ and switched capacitor 314. As further illustrated in FIG. 4, variable resistor $R_2$ and resistors $R_5$ and $R_6$ are coupled to the base of transistor Q2 to receive $V_{ref}$ and are also coupled to resistors $R_3$ and $R_4$. Similar to resistor $R_3$, resistor $R_2$ is also a trimmable variable resistor. In operation by knowing the temperature coefficient of the voltages $V_{ref}$ and $V_{ptat}$ of bandgap reference 228, in combination with the temperature coefficient of resistor $R_1$, resistor $R_2$ and $R_3$ can be trimmed to compensate for these temperature coefficients for a select operating temperature range.

For example, assuming $R_1$ has a negative temperature coefficient, the current to Q1 will increase with temperature as the resistance of $R_1$ decreases with increasing temperature. As described above, the current to capacitor 314 will not significantly fluctuate with the change in temperature. Therefore, to compensate for the increase in current through $R_1$, the current to $R_3$ must also be increased. Therefore, variable resistor $R_2$ can be trimmed to compensate for this.

During manufacture, a target temperature is selected, such that with a bandgap reference 228 with known temperature coefficients, resistors $R_2$ and $R_3$ will be trimmed to compensate for the absolute values of the combined temperature coefficients of $R_1$ and capacitor 314.

Those skilled in the art can realize that the teachings of the present invention as described hereinabove provides a monolithic oscillator having dual programmable fixed frequency outputs and includes crystal-less oscillator circuitry utilizing frequency-locked feedback to generate an signal having a select frequency, the frequency being stabilized over temperature and voltage by compensation circuitry associated with the crystal-less oscillator circuitry. A programmable prescaler is coupled to the crystal-less oscillator circuitry for varying the frequency of the signal generated by the crystal-less oscillator circuitry by a select amount. The monolithic oscillator further includes inputs for receiving an external signal, such as an external reference signal, or for connection to a crystal for providing an alternative frequency reference. A multiplexer is used to select either the external signal (or crystal) or the signal from the crystal-less oscillator circuitry to be used for the output signal. Monolithic oscillator further includes a programmable frequency divider coupled to the multiplexer to vary the frequency of the signal from the multiplexer by a select amount to one of the dual outputs. The other output being used as a reference output.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A monolithic oscillator comprising:
a crystal-less oscillator for generating a first signal having a select frequency;
said crystal-less oscillator including a frequency-lock feedback loop for stabilizing the frequency of said first signal, said frequency-lock feedback loop including a frequency-controlled resistor;
an input for receiving an external reference signal; and
a switching device coupled to said crystal-less oscillator for receiving said first signal and said switching device coupled to said input for receiving said reference signal, said switching device switchable to output at least one of said first signal and said reference signal.

2. The monolithic oscillator as recited in claim 1, and further comprising a frequency divider coupled between said crystal-less oscillator and said switching device, said frequency divider for modifying the frequency of said first signal by a select factor.

3. The monolithic oscillator as recited in claim 2, wherein said frequency divider is programmable.

4. The monolithic oscillator as recited in claim 1, and further comprising a frequency divider coupled to said switching device and an output, said frequency divider for modifying the frequency of the signal output by said switching device by a select factor.

5. The monolithic oscillator as recited in claim 4, wherein said frequency divider is programmable.

6. The monolithic oscillator as recited in claim 1, and further comprising temperature compensation circuitry coupled to said crystal-less oscillator.

7. The monolithic oscillator as recited in claim 1, and further comprising a power down-mode of operation, such that when in said power-down mode of operation, said crystal-less oscillator is disabled.

8. A monolithic crystal-less oscillator device comprising:
crystal-less oscillator circuitry for generating a first signal having a select frequency with an approximate maximum 1% variation over a select temperature range;
said crystal-less oscillator device including a frequency-lock feedback loop including a frequency-controlled resistor;
an input for receiving a second signal; and
a switching device coupled to said oscillator circuitry for receiving said first signal and said switching device coupled to said input for receiving said second signal, said switching device switchable to output at least one of said first signal and said second signal.

9. The device as recited in claim 8, wherein said oscillator circuitry includes a frequency-lock feedback loop for stabilizing the frequency of said first signal.

10. The device as recited in claim 9, and further comprising a prescaler coupled between said oscillator circuitry and said switching device, said prescaler for modifying the frequency of said first signal by a select factor.

11. The device as recited in claim 10, and further comprising a programmable frequency divider coupled to switching device for modifying the frequency of the signal output by said switching device by a select factor.

12. The device as recited in claim 11, wherein oscillator circuitry includes compensation circuitry for compensation for the temperature dependency of the oscillator circuitry.

13. A programmable oscillator device comprising:
a crystal-less oscillator for generating a first signal having selected frequency, said crystal-less oscillator including frequency-locked feedback for stabilizing the frequency of said first signal, said frequency-lock feedback loop including a frequency-controlled resistor;
a first input for receiving a second signal;
a switching device coupled to said programmable prescaler and further coupled to said first input, said switching device switchable to output one of said first signal and said second signal; and a programmable prescaler coupled to said crystal-less oscillator varying the frequency of said first signal by a selected amount.

14. The device as recited in claim 13, wherein said switching device includes a multiplexer.

15. The device as recited in claim 13, and further comprising a frequency divider coupled to said switching device, said frequency divider for modifying the frequency of the signal received from said switching device by a selected device.

16. The device as recited in claim 15, and further comprising:

a first output coupled to said switching device for outputting the signal output by said switching device; and a second output coupled to said frequency divider for outputting the signal modified by said frequency divider.

17. The device as recited in claim 16, and further comprising compensation circuitry coupled to said crystal-less oscillator, said compensation circuitry for providing compensation for the temperature dependency of said crystal-less oscillator over a select temperature range.

* * * * *

UNITED STATES PATENT AND TRADEMARK OFFICE
CERTIFICATE OF CORRECTION

PATENT NO : 5,982,241
DATED : November 9, 1999
INVENTOR(S) : Nguyen, et al.

It is certified that error appears in the above-identified patent and that said Letters Patent are hereby corrected as shown below:

On the title page: Item [56]

Attorney, Agent, or Firm  Replace "Jenkins" With --Jenkens--

Column 5, line 8  Replace "110," With --110--

Column 5, line 54  Replace "$f_{out}$ Control" With --$f_{out}$. (NEW PARAGRAPH) Control--

Column 6, line 4  Replace "Q32 CV" With --Q=CV--

Signed and Sealed this

Third Day of April, 2001

Attest:

NICHOLAS P. GODICI

Attesting Officer   Acting Director of the United States Patent and Trademark Office